United States Patent
Liu et al.

(10) Patent No.: US 6,225,223 B1
(45) Date of Patent: May 1, 2001

(54) METHOD TO ELIMINATE DISHING OF COPPER INTERCONNECTS

(75) Inventors: Chung-Shi Liu; Chen-Hua Yu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/374,297

(22) Filed: Aug. 16, 1999

(51) Int. Cl.[7] .................................................... H01L 21/44
(52) U.S. Cl. ............................................. 438/687; 438/637
(58) Field of Search ................................... 438/637, 672, 438/678, 697, 687, 751, 752; 257/762, 764, 768

(56) References Cited

U.S. PATENT DOCUMENTS

| | | | |
|---|---|---|---|
| 5,298,058 | 3/1994 | Matsui et al. | 106/1.23 |
| 5,308,796 | 5/1994 | Feldman et al. | 437/200 |
| 5,603,768 | 2/1997 | Yoon et al. | 118/500 |
| 5,674,787 | 10/1997 | Zhao et al. | 437/230 |
| 5,695,810 | 12/1997 | Dubin et al. | 427/96 |
| 5,723,387 | 3/1998 | Chen | 438/692 |
| 5,935,762 | * 8/1999 | Dai et al. | 430/312 |
| 5,969,422 | * 10/1999 | Ting et al. | 257/762 |
| 5,993,686 | * 11/1999 | Streinz et al. | 252/79.3 |
| 6,100,195 | * 8/2000 | Chan et al. | 438/687 |

* cited by examiner

*Primary Examiner*—David Nelms
*Assistant Examiner*—David Vu
(74) *Attorney, Agent, or Firm*—George O. Saile; Stephen B. Ackerman; Stephen G. Stanton

(57) ABSTRACT

A method of forming an interconnect, comprising the following steps. A dielectric layer, having an upper surface, is formed over a semiconductor structure. A trench, having side walls and a bottom, is formed within the dielectric layer. A barrier layer is then formed over the dielectric layer and lining the trench's side walls and bottom. A first copper layer is deposited on the barrier layer, filling the lined trench and blanket filling the barrier layer covered dielectric layer. The first copper layer is planarized, exposing the upper surface of the dielectric layer and forming a dished copper filled trench. A second copper layer is selectively deposited on the dished copper filled trench by either electroless plating or chemical vapor deposition (CVD). The second copper layer extending above the upper surface of the dielectric layer. The second copper layer is then planarized to form an essentially planar copper filled trench, or interconnect, level with the upper surface of said dielectric layer.

18 Claims, 1 Drawing Sheet

METHOD TO ELIMINATE DISHING OF COPPER INTERCONNECTS

FIELD OF THE INVENTION

The present invention relates generally to the formation of metal interconnects in microminiaturized integrated circuits and more specifically to methods for the formation of copper interconnects in microminiaturized integrated circuits in semiconductor devices.

BACKGROUND OF THE INVENTION

The copper (Cu) damascene method has become mainstream in the manufacture of copper interconnects in microminiaturized integrated circuits (IC). Currently, chemical mechanical polishing (CMP) of the copper layers causes dishing of the copper interconnects. This dishing causes reduced yields, reliability and unacceptable performance. The deleterious effects of dished copper interconnects accumulate interconnect level by interconnect level.

U.S. Pat No. 5,723,387 to Chen discloses a self-contained unit for forming copper metallurgy interconnection structures on semiconductor (SC) substrates that provides a way of reducing the number of times the wafer is transferred between the less environmentally clean wet process steps and very clean dry process steps. The copper may be deposited over and into a barrier layer lined substrate surface and groove by electroless and electroplating techniques. The copper layer is then polished to expose the barrier layer which is then etched away. The copper is then polished to planarize it with the substrate surface and a second barrier layer is selectively deposited on the copper by electroless plating techniques. After cleaning and drying, a second dielectric layer is applied and the steps are repeated to form additional metallurgy layers.

U.S. Pat. No. 5,308,796 to Feldman et al. discloses a selective copper plating process where palladium silicide is used as a catalytic surface. Copper plating is introduced only where the silicide is present.

U.S. Pat. No. 5,298,058 to Matsui et al. discloses an electroless copper plating bath comprising a water soluble copper salt, a complexing agent, and a reducing agent consisting of phosphorous acid or a phosphite. The bath is less expensive than conventional plating baths using hypophosphorous acid.

U.S. Pat. No. 5,603,768 to Yoon et al. discloses an apparatus using flow-inducing panels for electroless copper plating of complex plastic microwave assemblies.

U.S. Pat. No. 5,695,810 to Dubin et al. discloses a CoWP barrier layer and electroless copper interconnect processes.

U.S. Pat. No. 5,674,787 to Zhao et al. discloses an electroless copper deposition technique to form interconnects that does not require CMP to planarize the plug surface after selective formation of the plug in the via opening.

SUMMARY OF THE INVENTION

Accordingly, it is an object of the present invention to provide an improved method of forming copper interconnects.

Another object of the present invention is to provide an improved method of forming planarized copper interconnects facilitating well controlled photo, etching, thin film and chemical mechanical polishing (CMP) processes.

A further object of the present invention is to provide an improved method of forming copper interconnects by of a second electroless plated copper layer.

Yet another object of the present invention is to provide an improved method of forming copper interconnects by CMP of a second chemical vapor deposited copper layer.

Other objects will appear hereinafter.

It has now been discovered that the above and other objects of the present invention may be accomplished in the following manner. Specifically, a dielectric layer is formed on a semiconductor structure. A trench is formed through the dielectric layer. A barrier layer is then deposited on the dielectric layer and in the trench. A first copper (Cu) layer is formed by depositing Cu on the barrier layer filling the trench and blanket filling the dielectric layer. The first Cu layer and the barrier layer on the upper surface of the semiconductor structure are planarized by chemical mechanical polishing (CMP), exposing the upper surface of the dielectric layer and leaving a dished Cu filled trench. Copper is then selectively deposited on the dished Cu filled trench either by electroless plating or chemical vapor deposition forming a second Cu layer extending above the upper surface of the dielectric layer. The second Cu layer is then planarized level with the upper surface of the dielectric layer forming a Cu interconnect.

BRIEF DESCRIPTION OF THE DRAWINGS

The features and advantages of the method of eliminating dishing of copper interconnects according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

Figure 1:
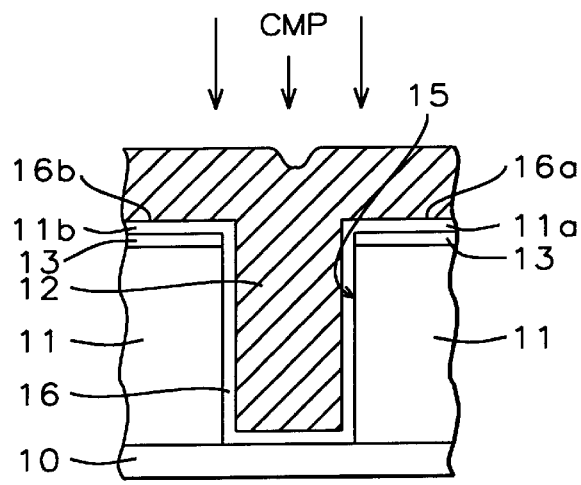
FIGS. 1 to 4 show a series of schematic cross-sectional diagrams illustrating the results of progressive stages in forming within a trench, within a semiconductor structure employed in integrated circuit fabrication, a planarized copper interconnect, in accordance with a preferred embodiment of the method of the present invention.

Accordingly as shown in FIG. 1, dielectric layer 11 having an upper surface is formed on semiconductor structure 10 by any conventional method. For example, dielectric layer 11 may be formed by chemical vapor deposition (CVD) of plasma enhanced oxide (PEOX) at about 400° C., or by deposition of a low k material deposited by a spin-on method.

An underlying etch stop layer 13 may first be deposited under dielectric layer 11 by chemical vapor deposition of PEOX/PESiN (plasma enhanced oxide/plasma enhanced silicon nitride) at about 400° C. and from about 300 to 800 watts using $N_2O+SiH_4$ (silane)/$NH_3+SiH_4$, respectively.

Dielectric layer 11 is preferably comprised of silicon oxide ($SiO_2$) and is from 4000 to 10,000 Å thick. Dielectric layer 11 electrically isolates subsequently formed interconnect lines from any underlying conductive layer. Semiconductor substrate 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Trench 15, having side walls and a bottom, is formed within dielectric layer 11 by any conventional method, with an anisotropic dry etch using $CF_4/O_2$ gas, being the preferred method. Trench 15 is from about 0.1 to 2 µm wide, depending on the geometry and layers. Trench 15 separates the upper surface of dielectric layer 11 into segments 11a and 11b.

Barrier layer 16 is preferably comprised of tantalum (Ta) or tantalum nitride (TaN) and is deposited over dielectric layer 11 and in trench 15 preferably by an ionized metal plasma (IMP) including Ta or TaN. Ionized metal plasma is different from conventional physical vapor deposition (PVD) by adding a RF coil around the chamber to ionize the sputtered metal by self bias or external bias such that the bottom coverage of the trench or via hole will increase. Barrier layer 16 may also be deposited by CVD using, preferably, the AMAT (Applied Materials) Endura system. TiN (titanium nitride) or $WN_x$ (tungsten nitride), etc., may also be used in place of Ta or TaN.

Barrier layer 16 is from about 100 to 500 Å thick and more preferably 300 Å thick. Barrier layer portions 16a, 16b overlie upper surface segments 11a, 11b, respectively, of dielectric layer 11. Barrier layer 16 prevents spiking of subsequently deposited copper layers 12, 20 into dielectric layer 11 and/or semiconductor structure 10 and increases adhesion of subsequently deposited copper layers 12, 20 to the underlying dielectric layer 11 and/or semiconductor structure 10.

First Cu layer 12 is then deposited over barrier layer 16, blanket filling dielectric layer 11, and filling trench 15. First Cu layer 12 is from about 1000 to 2500 Å thick and more preferably 2000 Å thick and is preferably deposited, as may the Cu seed layer (not shown), by IMP Cu using the AMAT Endura system followed by an electrochemical Cu plating deposition to fill trench 15, or via hole, at room temperature.

Figure 2:
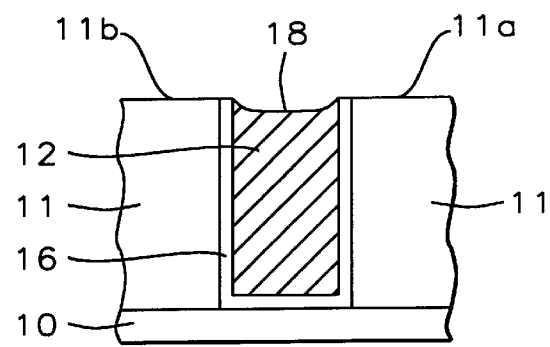

First Cu layer 12, barrier layer portions 16a and 16b, and etch stop layer 13 are chemically mechanically polished (CMP) exposing upper surface segments 11a and 11b to form the structure shown in FIG. 2. Alternatively, etch stop layer 13 may remain. The following parameters are used in the CMP polishing: 5 psi down force with a table speed of 30 rpm using a 200 sccm slurry in an IPEC tool or AMAT Mirra tool at room temperature with the slurry consisting of $H_2O_2$, (nitric acid and/or ammonium chloride and/or ammonia), BTA (benzotriazole)—a corrosion inhibitor—and $Al_2O_3$.

As shown in FIG. 2 at 18, the remaining first Cu layer 12 within barrier layer 16 lined trench 15 is dished. Dishing 18 of first Cu layer 12 within trench 15 after CMP is caused by the galvanic action between barrier layer 16 and first Cu layer 12, that is dishing comes from the polishing rate difference between barrier layer 16 and Cu layer 12 with the galvanic action accelerating the chemical etching reaction.

Dishing 18 causes reduced yields, reliability and unacceptable performance. The deleterious effects of this dished first Cu layer 12 interconnect will accumulate interconnect level by interconnect level. The inventors have discovered that the following methods eliminate this undesired dishing 18 of the Cu interconnect formed.

Figure 3:
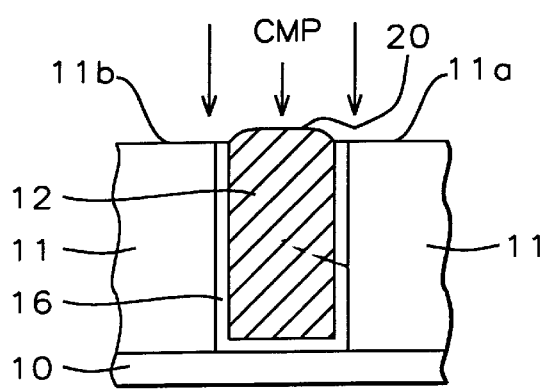

As shown in FIG. 3, a second Cu layer 20 is selectively deposited over dished 18 first Cu layer 12 within trench 15 by either electroless plating, the preferred method, or by chemical vapor deposition (CVD).

The selective electroless plating of second Cu layer 20 over dished 18 first Cu layer 12 may be performed by various methods, such as the process similar to that disclosed in the Zhao et al. U.S. Pat. No. 5,674,787, and preferably under the following parameters: pH from about 10 to 12 and preferably 11; from about 45 to 55° C. and preferably 50° C.; and using a solution of $CuSO_4$ plus EDTA plus formaldehyde (HCHO) plus $H_2O$.

The selective CVD of second Cu layer 20 over dished 18 first Cu layer 12 may be performed using trimethylvinlsilyl (tmvs) hexafluroacetylacetonate (hfac) copper I (as a source of copper) deposited from about 5 mT (millitorr) to 200 mT.

Figure 4:
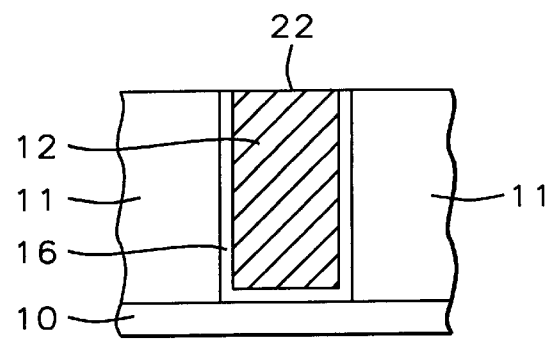

Second Cu layer 20 is generally dome shaped and extends above upper surface segments 11a and 11b of dielectric layer 11 as shown in FIG. 3. Second Cu layer 20 is then planarized by CMP level with upper surface segments 11a and 11b to form the Cu interconnect structure shown in FIG. 4. The CMP of second Cu layer 20 is performed at the same parameters as the CMP of first Cu layer 12 as noted above.

The formation of a planarized Cu interconnect allows for well-controlled Cu resistance distribution and facilitates well-controlled photo, etching, thin film and CMP processes.

While particular embodiments of the present invention have been illustrated and described, it is not intended to limit the invention, except as defined by the following claims.

We claim:

1. A method of forming an interconnect, comprising the steps of:

providing a semiconductor structure;

forming a dielectric layer over said semiconductor structure, said dielectric layer having an upper surface;

forming a trench within said dielectric layer, said trench having side walls and a bottom;

forming a barrier layer over said dielectric layer and lining said trench side walls and bottom;

depositing copper on said barrier layer to form a first copper layer filling said lined trench and blanket filling said barrier layer covered dielectric layer;

planarizing said first copper layer and said barrier layer on said upper surface of said dielectric layer, exposing said upper surface of said dielectric layer and forming a dished copper filled trench; and selectively depositing copper on said dished copper filled trench to form a second copper layer over said dished copper filled trench and extending above said upper surface of said dielectric layer.

2. The method of claim 1, wherein said barrier layer is comprised of Ta.

3. The method of claim 1, wherein said barrier layer is comprised of TaN.

4. The method of claim 1, wherein said selective deposition of copper may be by electroless plating or electrochemical deposition; and further including the step of:

planarizing said second copper layer to form an essentially planar copper interconnect level with said copper surface of said dielectric layer.

5. The method of claim 1, wherein said dielectric layer is from about 6000 to 15,000 Å thick and said dielectric layer further includes an underlying etch stop layer comprised of SiN.

6. The method of claim 1, wherein said barrier layer is from about 100 to 500 Å thick.

7. The method of claim 1, wherein said trench is from about 2000 to 10,000 Å wide.

8. The method of claim 1, wherein said first copper layer planarization is performed by chemical mechanical polishing using a 200 sccm slurry comprised of $Al_2O_3$, $H_2O_2$, benzotriazole, and (nitric acid or an ammonia containing compound) at 5 psi down force.

9. The method of claim 1, wherein said electroless copper plating is performed at a pH form about 10 to 12, a temperature from about 45 to 55° C., and using a solution comprised of $CuSO_4$, EDTA, formaldehyde, and $H_2O$.

10. A method of forming an interconnect, comprising the steps of:

providing a semiconductor structure;

forming a dielectric layer over said semiconductor structure, said dielectric layer having an upper surface;

forming a trench within said dielectric layer, said trench having side walls and a bottom;

forming a barrier layer over said dielectric layer and lining said trench side walls and bottom;

depositing copper on said barrier layer to form a first copper layer filling said lined trench and blanket filling said barrier layer covered dielectric layer;

planarizing said first copper layer and said barrier layer on said upper surface of said dielectric layer, exposing said upper surface of said dielectric layer and forming a dished copper filled trench;

selectively depositing copper on said dished copper filled trench to form a second copper layer over said dished copper filled trench and extending above said upper surface of said dielectric layer; and planarizing said second copper layer to form an essentially planar copper interconnect level with said upper surface of said dielectric layer.

11. The method of claim 10, wherein said barrier layer is comprised of Ta.

12. The method of claim 10, wherein said barrier layer is comprised of TaN.

13. The method of claim 10, wherein said selective deposition of copper may be by chemical vapor deposition; and further including the step of:

planarizing said second copper layer to form an essentially planar copper interconnect level with said copper surface of said dielectric layer.

14. The method of claim 10, wherein said dielectric layer is from about 6000 to 15,000 Å thick and said dielectric layer further includes an underlying etch stop layer comprised of SiN.

15. The method of claim 10, wherein said barrier layer is from about 100 to 500 Å thick.

16. The method of claim 10, wherein said trench is from about 2000 to 10,000 Å wide.

17. The method of claim 10, wherein said first copper layer planarization is performed by chemical mechanical polishing using a 200 sccm slurry comprised of $Al_2O_3$, $H_2O_2$, benzotriazole, and (nitric acid or an ammonia containing compound) at 5 psi down force.

18. The method of claim 10, wherein said selective deposition of copper may be by chemical vapor deposition, and said selective chemical vapor deposition of copper is performed using trimethylvinlsilyl (tmvs) hexafluroacetylacetonate (hfac) copper I as a source of copper that is deposited from about 5 milliTorr to 200 milliTorr.

* * * * *